(12) United States Patent
Xin et al.

(10) Patent No.: US 12,195,348 B2
(45) Date of Patent: Jan. 14, 2025

(54) METHOD FOR MAKING INORGANIC PEROVSKITE NANOCRYSTALS FILM AND APPLICATIONS

(71) Applicant: KING ABDULLAH UNIVERSITY OF SCIENCE AND TECHNOLOGY, Thuwal (SA)

(72) Inventors: Bin Xin, Thuwal (SA); Iman Roqan, Thuwal (SA); Yuhai Zhang, Jinan (CN); Somak Mitra, Thuwal (SA); Yusin Pak, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 932 days.

(21) Appl. No.: 17/272,960

(22) PCT Filed: Sep. 5, 2019

(86) PCT No.: PCT/IB2019/057492
§ 371 (c)(1),
(2) Date: Mar. 3, 2021

(87) PCT Pub. No.: WO2020/049499
PCT Pub. Date: Mar. 12, 2020

(65) Prior Publication Data
US 2021/0340021 A1 Nov. 4, 2021

Related U.S. Application Data

(60) Provisional application No. 62/727,698, filed on Sep. 6, 2018.

(51) Int. Cl.
*H01L 31/032* (2006.01)
*C01G 21/00* (2006.01)
(Continued)

(52) U.S. Cl.
CPC .......... *C01G 21/006* (2013.01); *H01L 31/032* (2013.01); *H01L 31/035281* (2013.01);
(Continued)

(58) Field of Classification Search
CPC ................ C01G 21/006; H01L 31/032; H01L 31/035281; H01L 31/18; C01P 2002/34;
(Continued)

(56) References Cited

U.S. PATENT DOCUMENTS 9,260,595 B1 * 2/2016 Holcombe, Jr. .......... C08L 1/02
11,355,720 B2 * 6/2022 Li .......................... H10K 71/40
(Continued)

FOREIGN PATENT DOCUMENTS

CN    104388089 A   *  3/2015   .......... B01D 17/047
CN    106784162 B   *  9/2018
(Continued)

OTHER PUBLICATIONS

Akkerman, Q.A., et al., "Solution Synthesis Approach to Colloidal Cesium Lead Halide Perovskite Nanoplatelets with Monolayer-Level Thickness Control," Journal of the American Chemical Society (JACS), vol. 138, Issue 3, 2016 (Published Jan. 2, 2016), pp. 1010-1016.
(Continued)

*Primary Examiner* — Eduardo A Rodela
(74) *Attorney, Agent, or Firm* — PATENT PORTFOLIO BUILDERS PLLC

(57) ABSTRACT

A method for forming $CsPbBr_3$ perovskite nanocrystals into a two-dimensional (2D) nanosheet includes providing $CsPbBr_3$ perovskite nanocrystals; mixing the $CsPbBr_3$ perovskite nanocrystals into a mixture of a first solvent and a second solvent, to form a solution of the $CsPbBr_3$ perovskite nanocrystals, the first solvent, and the second solvent; and forming an optoelectronic device by patterning the $CsPbBr_3$
(Continued)

perovskite nanocrystals into a nanosheet, between first and second electrodes. The first solvent is selected to evaporate before the second solvent.

16 Claims, 16 Drawing Sheets

(51) Int. Cl.
    H01L 31/0352        (2006.01)
    H01L 31/18          (2006.01)
(52) U.S. Cl.
    CPC .......... H01L 31/18 (2013.01); *C01P 2002/34* (2013.01); *C01P 2002/72* (2013.01); *C01P 2004/04* (2013.01); *C01P 2004/24* (2013.01); *C01P 2006/40* (2013.01)
(58) Field of Classification Search
    CPC .............. C01P 2002/72; C01P 2004/04; C01P 2004/24; C01P 2006/40
    See application file for complete search history.

(56) References Cited

U.S. PATENT DOCUMENTS

| | | | | |
|---|---|---|---|---|
| 2017/0222162 | A1* | 8/2017 | Lee | H10K 85/10 |
| 2018/0006254 | A1* | 1/2018 | Mohite | H10K 30/20 |
| 2019/0013155 | A1* | 1/2019 | Fujinuma | H01G 9/2009 |

FOREIGN PATENT DOCUMENTS

| | | | | | |
|---|---|---|---|---|---|
| CN | 209892392 | U | * | 1/2020 | |
| CN | 113845142 | A | * | 12/2021 | |
| CN | 114730810 | A | * | 7/2022 | H01L 31/0272 |
| CN | 109030380 | B | * | 8/2023 | G01N 21/01 |

OTHER PUBLICATIONS

Akkerman, Q.A., et al., "Strongly emissive perovskite nanocrystal inks for high-voltage solar cells," Nature Energy, vol. 2, No. 2, Article 16194, Dec. 2016 (Published Dec. 22, 2016), pp. 1-7 (8 pages total).
Bekenstein, Y., et al., "Highly Luminescent Colloidal Nanoplates of Perovskite Cesium Lead Halide and Their Oriented Assemblies," Journal of the American Chemical Society (JACS), vol. 137, Issue 51, 2015 (Published Dec. 15, 2015), pp. 16008-16011.
Cai, Y., et al., "Marangoni Flow-Induced Self-Assembly of Hexagonal and Stripelike Nanoparticle Patterns," Journal of the American Chemical Society (JACS), vol. 130, Issue 19, 2008 (Published on Web Apr. 22, 2008), pp. 6076-6077.
Li, X., et al., "Healing All-Inorganic Perovskite Films via Recyclable Dissolution-Recrystallization for Compact and Smooth Carrier Channels of Optoelectronic Devices with High Stability," Advanced Functional Materials, vol. 26, Issue 32, Aug. 23, 2016 (Published online Jun. 14, 2016), pp. 5903-5912.
Lv, L., et al., "Generalized colloidal synthesis of high-quality, two-dimensional cesium lead halide perovskite hanosheets and their applications in photodetectors," Nanoscale, vol. 8, Issue 28, 2016 (First Published Jun. 21, 2016), pp. 13589-13596.
PCT International Search Report (Forms PCT/ISA/220 and PCT/ISA/210) for corresponding/related International Application No. PCT/IB2019/057492 dated Dec. 9, 2019.
PCT Written Opinion of the International Searching Authority (Form PCT/ISA/237) for corresponding/related International Application No. PCT/IB2019/057492 dated Dec. 9, 2019.
Ramasamy, P., et al., "All-inorganic cesium lead halide perovskite nanocrystals for photodetector applications," Chem. Commun., vol. 52, Issue 10, 2016 (First Published Dec. 7, 2015), pp. 2067-2070.
Shamsi, J., et al., "Colloidal Synthesis of Quantum Confined Single Crystal CsPbBr? Nanosheets with Lateral Size Control up to the Micrometer Range," Journal of the American Chemical Society (JACS), vol. 138, Issue 23, Jun. 15, 2016 (Published May 26, 2016), pp. 7240-7243.
Song, J., et al., "Monolayer and Few-Layer All-Inorganic Perovskites as a New Family of Two-Dimensional Semiconductors for Printable Optoelectronic Devices," Advanced Materials, vol. 28, Issue 24, Jun. 22, 2016 (Published online Apr. 25, 2016), pp. 4861-4869.
Kin, B., et al., "Self-Patterned CsPbBr? Nanocrystals for High-Performance Optoelectronics," ACS Applied Materials & Interfaces, vol. 11, Issue 5, Feb. 6, 2019 (Published Jan. 8, 2019), pp. 5223-5231.

* cited by examiner

METHOD FOR MAKING INORGANIC PEROVSKITE NANOCRYSTALS FILM AND APPLICATIONS

CROSS-REFERENCE TO RELATED APPLICATIONS

This application is a U.S. National Stage Application of International Application No. PCT/IB2019/057492, which claims priority to U.S. Provisional Patent Application No. 62/727,698, filed on Sep. 6, 2018, entitled "METHOD OF SYNTHESIZING CRACK-FREE INORGANIC PEROVSKITE NANOCRYSTALS FILM, SELECTIVELY ALTERED FROM LARGE-AREA TO PATTERNED SMALL AREA FOR HIGH-PERFORMANCE DEVICES," the disclosure of which are incorporated herein by reference in their entirety.

BACKGROUND

Technical Field

Embodiments of the subject matter disclosed herein generally relate to a method for synthesizing all-inorganic lead halide perovskites, and more particularly, to a method for producing $CsPbBr_3$ perovskite nanocrystals with two-dimensional (2D) nanosheet features and making an optoelectronic device that includes such nanosheet structure.

Discussion of the Background

During the past several years, perovskite materials have attracted the interest of the industry due to their unique characteristics that make them suitable candidates for a wide range of electronic, optoelectronic, and photovoltaic applications. For example, the power conversion efficiency of solar cells based on organic-inorganic halide $MAPbX_3$ ($MA=CH_3NH_3$) hybrid perovskites was reported to exceed 22.7%.

However, such hybrid perovskites suffer from many problems associated with their instability, thus hindering their practical applications. For example, the hybrid perovskites extreme sensitivity to both oxygen and moisture makes them to require critical environmental conditions during storage, fabrication, and device operation, which complicates their processing and increases their manufacturing cost. In addition, photo and thermal instabilities of such materials have also been observed due to the influence of various organic groups that are present in such materials.

A solution to this problem is the use of an all-inorganic cesium lead halide ($CsPbX_3$) perovskite without any organic moiety. This compound has emerged as an alternative candidate for next-generation optoelectronic applications due to its superior stability compared to hybrid perovskites. One of its advantages include the high-quantum yield (up to 90%), tunable photoluminescence (PL) emission spectra over the entire visible range with a narrow line width, suppressed PL blinking, high carrier mobility, and large diffusion length.

However, some issues related to the inorganic $CsPbX_3$ perovskite must be overcome before their use in practical devices. As compact and smooth carrier channels are required for high-device performance, it is desired that the perovskite active layer is of a high-quality crystal. Yet, due to several unresolved issues, it is currently challenging to achieve such requirements for $CsPbX_3$ perovskite-based devices. In this regard, during the $CsPbX_3$ film fabrication, the fast solvent evaporation usually destroys the film continuity, which leads to pinholes, grain boundaries and cracks to appear in the final product. In addition, the surfactants required for achieving considerable colloidal dispersivity destroy the carrier channels formed between the perovskite nanostructures.

These above noted shortcomings pertain to all kinds of solution-processed $CsPbX_3$ films because of the low solubility of the $CsPbX_3$ precursors. Consequently, one-step processed films made with this material exhibit poor continuity and limited thickness controllability.

In the past, a general strategy for enhancing film continuity based on improving inherent $CsPbX_3$ properties has been employed and included the use of oriented $CsPbX_3$ nanostructures, such as one-dimensional (1D) nanowires or two-dimensional (2D) nanosheets. Nevertheless, these methods have failed to eliminate the grain boundaries that can hinder the transport properties of the $CsPbX_3$ based materials.

Recently, to enhance the film continuity of this material, additional treatment methods were employed, such as carbon nanotube mixing, recyclable dissolution-recrystallization, sintering, centrifugal-casting, and freeze-drying casting. However, employing these treatment methods make the film fabrication process even more complex, while failing to produce a smoother surface.

Hence, there is a significant need to enhance the $CsPbX_3$ perovskite synthesis methods for practical high-performance devices and to overcome the above noted problems.

BRIEF SUMMARY OF THE INVENTION

According to an embodiment, there is a method for forming $CsPbBr_3$ perovskite nanocrystals into a two-dimensional (2D) nanosheet. The method includes providing $CsPbBr_3$ perovskite nanocrystals; mixing the $CsPbBr_3$ perovskite nanocrystals into a mixture of a first solvent and a second solvent, to form a solution of the $CsPbBr_3$ perovskite nanocrystals, the first solvent, and the second solvent; and forming an optoelectronic device by patterning the $CsPbBr_3$ perovskite nanocrystals into a nanosheet, between first and second electrodes. The first solvent is selected to evaporate before the second solvent.

According to another embodiment, there is an optoelectronic device that includes a substrate, first and second electrodes patterned on the substrate, and a nanosheet of $CsPbBr_3$ perovskite nanocrystals formed between the first and second electrodes. Traces of a first ligand and a second ligand are present in or around the nanosheet, and the nanosheet of $CsPbBr_3$ perovskite nanocrystals is formed in the presence of a first solvent and a second solvent to be free of cracks.

According to still another embodiment, there is a method for assembling inorganic perovskite nanocrystals into a two-dimensional (2D) nanosheet. The method includes providing inorganic perovskite nanocrystals, mixing the inorganic perovskite nanocrystals into a mixture of a first solvent and a second solvent to form a solution of the inorganic perovskite nanocrystals, the first solvent, and the second solvent, and forming an optoelectronic device by patterning the inorganic perovskite nanocrystals into a nanosheet, between first and second electrodes. The first solvent is selected to evaporate before the second solvent.

BRIEF DESCRIPTION OF THE DRAWINGS

For a more complete understanding of the present invention, reference is now made to the following descriptions taken in conjunction with the accompanying drawings, in which.

DETAILED DESCRIPTION OF THE INVENTION

The following description of the embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to CsPbBr$_3$ nanocrystals assembled into the nanosheet. However, the principles discussed with regard to CsPbBr$_3$ nanocrystals assembled into the nanosheet may be also applied to other inorganic perovskite materials, or to CsPbBr$_3$ nanocrystals that assembly in plural nanosheets.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

According to an embodiment, a room-temperature synthesis method is now discussed to obtain high-optical quality CsPbBr$_3$ nanocrystals (NCs) with 2D nanosheet features. The CsPbBr$_3$ NCs discussed herein self-assemble into one or more nanosheets as discussed later. A self-assembly property of ligand interactions between nanosheets generates high-quality, continuous perovskite films across a large area. This novel method, which is called herein the "double solvent evaporation inducing self-patterning" (DSEISP), is used to fabricate an optoelectronic device, for example, a photodetector (PD) device, in selected areas of a substrate, as discussed later in more detail. Based on the outstanding properties of CsPbBr$_3$ NCs, long-term thermally durable, flexible, and highly responsive optoelectronic device can be formed, which are extremely desirable in optoelectronic applications. Other devices may also be formed based on this novel method as later discussed.

Figure 1:
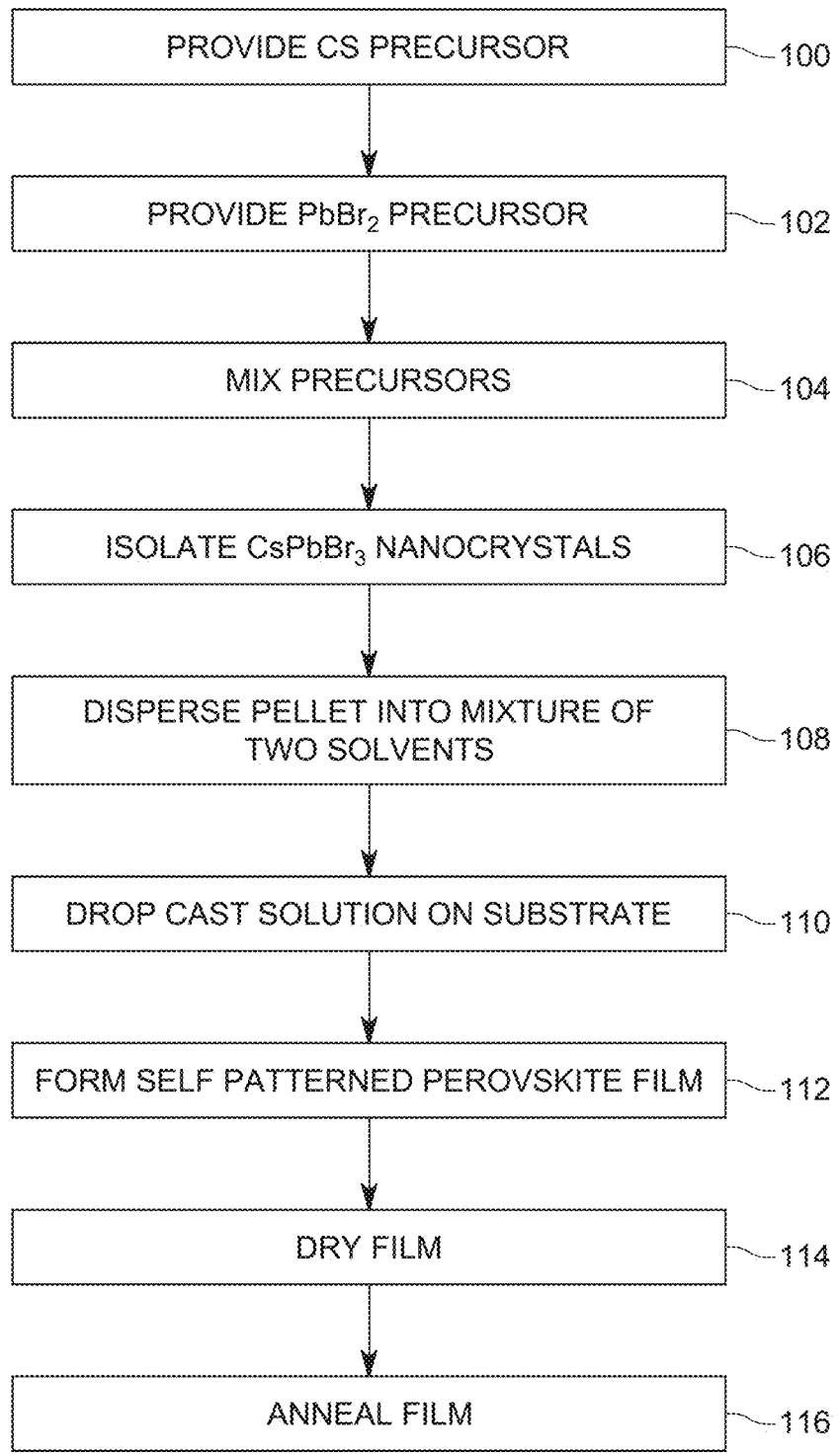
FIG. 1 is a flowchart of a method for synthetizing CsPbBr$_3$ nanocrystals assembled into a 2D nanosheet.

A method for forming CsPbBr$_3$ NCs with 2D nanosheet features is now discussed with regard to FIG. 1. The method includes a step 100 of providing a Cs precursor and a step 102 of providing a PbBr$_2$ precursor. The Cs precursor solution was prepared in step 100, for example, by dissolving 32 mg of CsAc (cesium acetate) in 1 mL of 1-PrOH (1-propanol) in a 20-mL vial under stirring in air, at room temperature, followed by a step of adding 6 mL of Hex (n-hexane) and 2 mL of 1-PrOH.

The PbBr$_2$ precursor solution was prepared in step 102 by dissolving 245 mg of PbBr$_2$ (lead bromide) into a mixture solution of 0.45 mL of 1-PrOH, OcAc (octanoic acid) and OcAm (octylamine), each at 90° C., in air, under vigorous stirring.

These two precursors were prepared separately. In step 104, the two precursors are mixed so that a reaction is initiated by injecting the latter into the former. The hot PbBr$_2$ precursor was injected into the Cs precursor in step 104 swiftly, under vigorous stirring, at room temperature. The system turned green immediately, and the reaction completed in about two minutes. The obtained CsPbBr$_3$ NCs were isolated in step 106 by centrifugation, for example, at 7000 rpm, and the obtained pellet was dispersed into a mixture of first and second solvents in step 108. In one embodiment, the first and second solvents are hexane and toluene, respectively. Other solvents may be used. In one application, the mixture of the hexane and toluene includes an equal volume of each solvent (for example, a 3~6 μl of hexane and a volume of 3~6 μl of toluene), so that a ratio between the hexane and toluene is in the range 1:2~2:1. The amount of CsPbBr$_3$ NCs added to the mixture of the two solvents is about 30 mg/ml. Those skilled in the art would understand that these quantities may be changed, for example, in a range of +/−20% and still achieve the desired results.

Figure 2A:
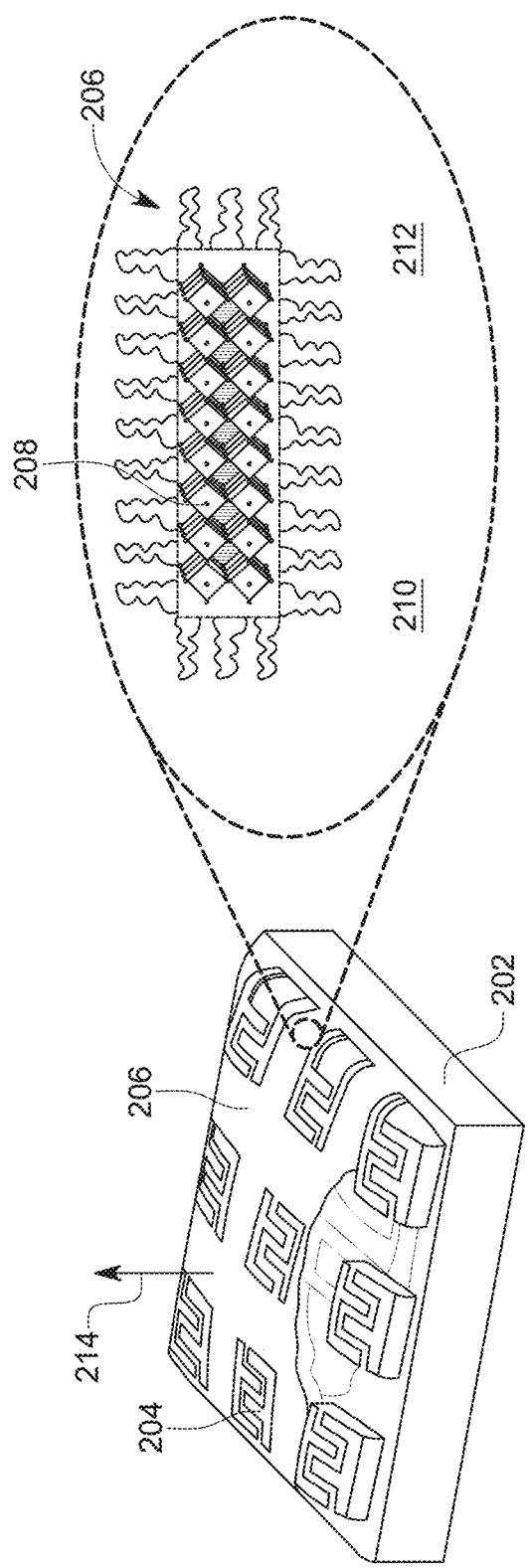
FIGS. 2A to 2C illustrate the various stages of an optoelectronic device manufactured by assembling CsPbBr$_3$ nanocrystals into the 2D nanosheet.

Then, in step 110, the solution obtained in step 108 is drop casted on an electrode-patterned wafer, as shown in FIG. 2A.

Figure 2B:
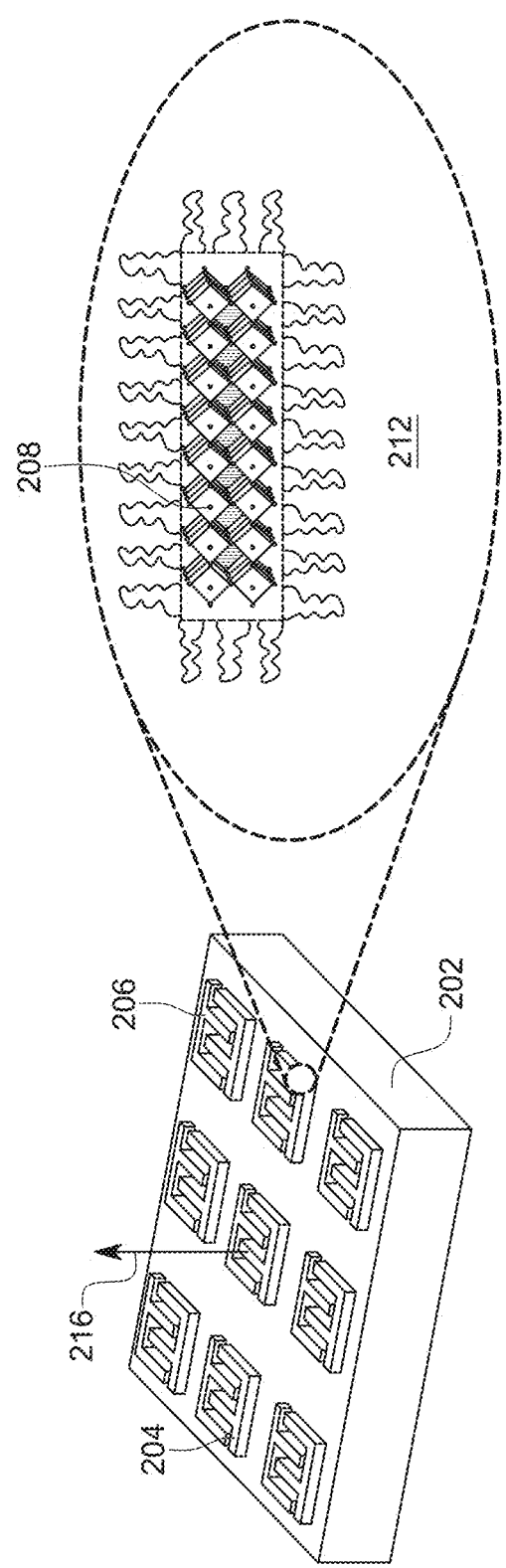
Figure 2C:
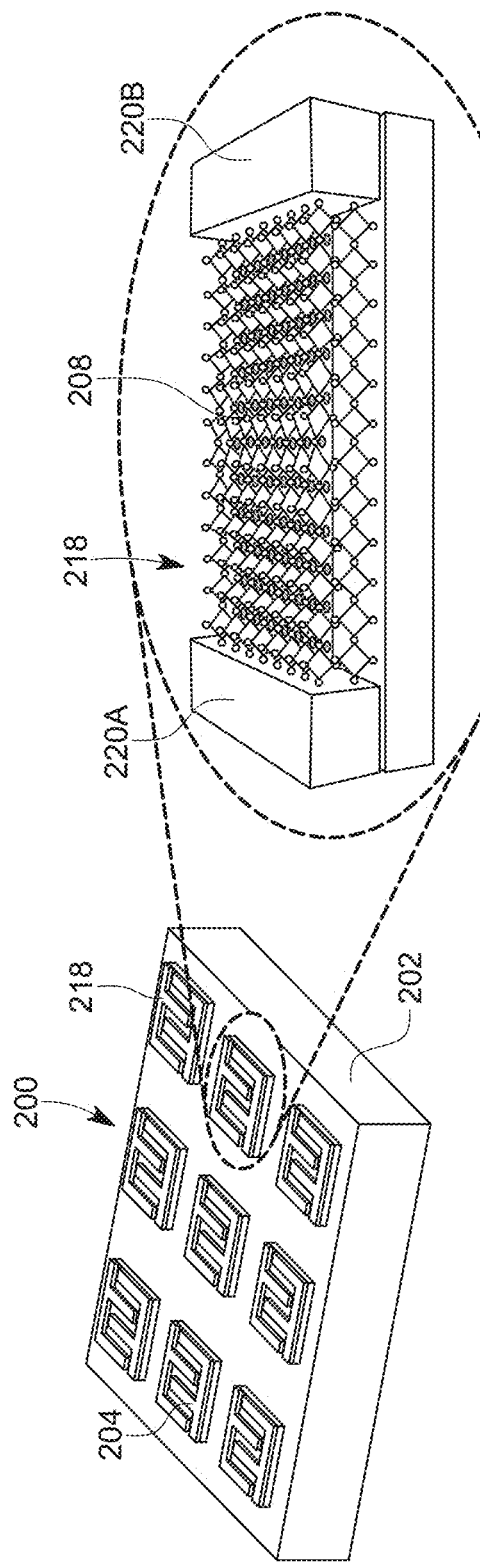

FIG. 2A shows the electrode-patterned wafer having a base 202 on which plural electrode pads 204 are formed. Each electrode pad may include one or more distinct electrodes. The solution 206 obtained in step 108, which includes $CsPbBr_3$ NCs 208, hexane 210 and toluene 212, experiences initially the hexane evaporation, as indicated by arrow 214. Note that the hexane evaporates at a lower temperature than toluene and the two solvents have been selected on purpose so that the first solvent evaporates first and then the second solvent evaporates. After some time, FIG. 2B shows that the entire hexane 210 has evaporated and only part of the toluene 212 is left, and also the $CsPbBr_3$ NCs 208. As the time passes, the toluene 212 also evaporates, which is indicated by arrow 216 in FIG. 2B, leading in step 112 to the spontaneous self-assembly of the $CsPbBr_3$ NCs 208 on the patterned electrode area 204, for example, between two electrodes 220A and 220B on the substrate 202, as shown in FIG. 2C, which results in the self-patterned perovskite nanosheet film 218. However, although the hexane and toluene have completely evaporated, trace amounts of octylamine and octanoic acid can be found on the substrate, in or around the $CsPbBr_3$ NCs nanosheet 218 that is formed there. The trace amounts of the two substances are understood herein to be amounts less than 0.1% by mass of the mass of the formed nanosheet. Therefore, an optoelectronic device 200 (an optoelectronic device is defined herein as being a device that responds to electromagnetic waves, especially optical waves, and changes its electrical output as, for example, a photodetector or solar cell) is obtained and includes at least a pad having two electrodes that sandwich the $CsPbBr_3$ NCs nanosheet 218.

This process of self-assembly of the $CsPbBr_3$ NCs 208 into the nanosheet 218 is due to the nature of the two solvents, where the first solvent is hexane and the second solvent is toluene. In step 114, the electro-patterned wafer was kept for a preset amount of time, for example, up to 10 minutes to complete the drying of the device, i.e., the evaporation of the first and second solvents. Note that the first solvent is selected, as discussed later, to evaporate much faster than the second solvent. In step 116, the substrate with the $CsPbBr_3$ NCs nanosheet was annealed, for example, on a hot plate, for a given time (e.g., 10 minutes but shorter or longer times may be used). This step, as discussed later, activates the formed system as the annealing appears to remove the surfactant and regrow the crystal, as well reduces the defects and thus improves the carrier diffusion length. This step can take place at a temperature between 100 and 150° C. In one application, the annealing takes place substantially at 110° C., where the term substantially is defined herein as including any temperature in a arrange of 110+/− 10% ° C.

While the embodiment discussed above presents some specific values for various parameters, those skilled in the art would understand that some variation of these parameters is possible while still achieving the same end result. Thus, the specific numbers disclosed with regard to this method should not be construed as being limiting, just exemplary.

Figure 3A:
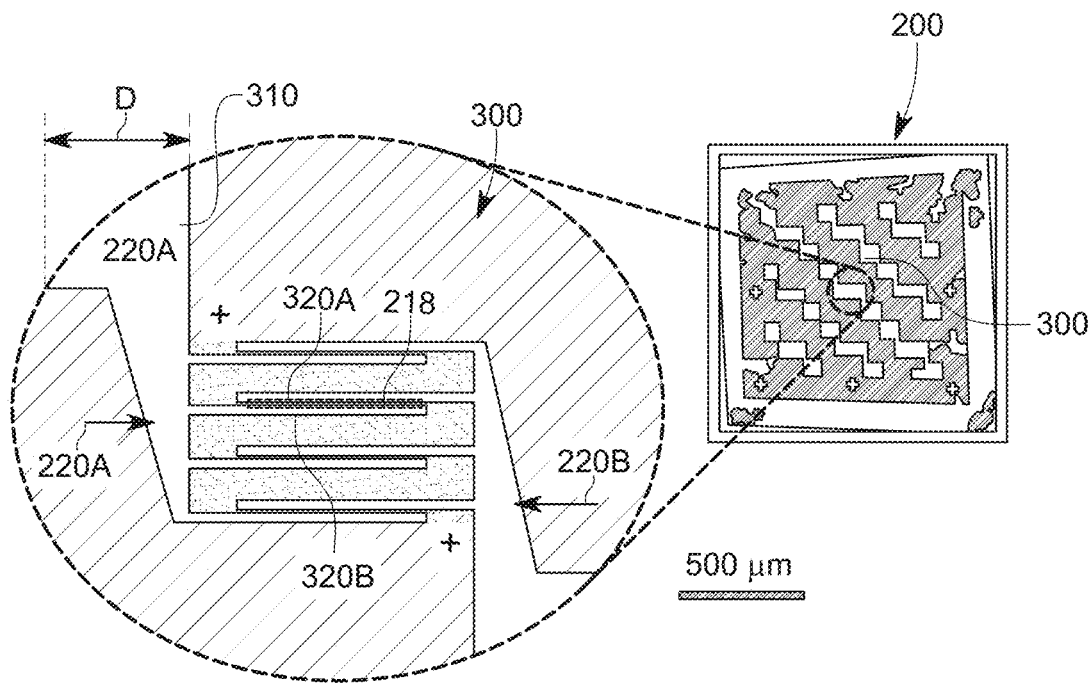
FIG. 3A illustrates in more detail the electrodes of the optoelectronic device and how the nanosheet self-assemblies between them.

The step 112 of self-assembly of the $CsPbBr_3$ NCs 208 is now discussed in more detail with regard to FIGS. 3A-3D. FIG. 3A shows the $CsPbBr_3$ NCs nanosheet based optoelectronic device 200 and a detail 300 of this device is shown having first and second electrodes 220A and 220B. These electrodes have plural fingers that form interdigitated electrodes, and a pair (320A and 320B) of such electrodes are shown having the $CsPbBr_3$ NCs nanosheet 218 already formed between the electrodes. Note that in this application, at least one dimension of the nanosheet 218 has a size in the nanometers range. In this specific embodiment, the dimension is the thickness. A size D of a pad 310 to which the electrodes are attached is about 1 to 3 mm.

Figure 3B:
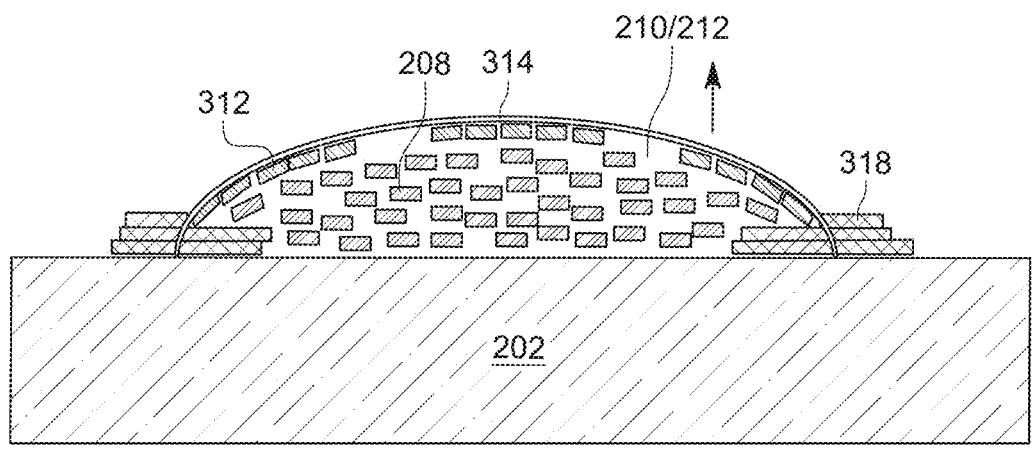
FIG. 3B illustrates how the nanosheet forms.
Figure 3C:
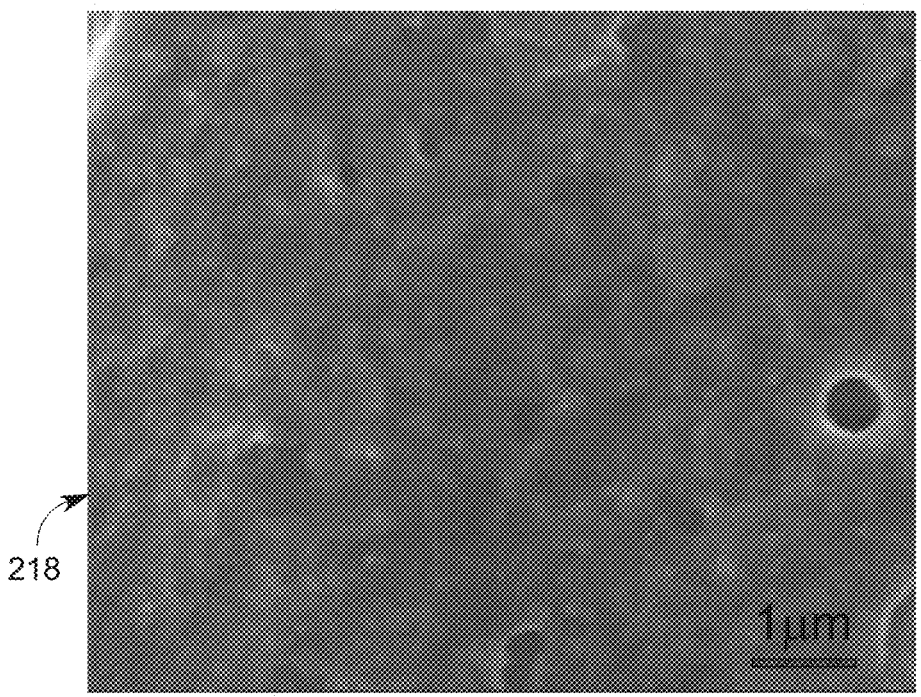
FIG. 3C illustrates the quality of the nanosheet.
Figure 3D:
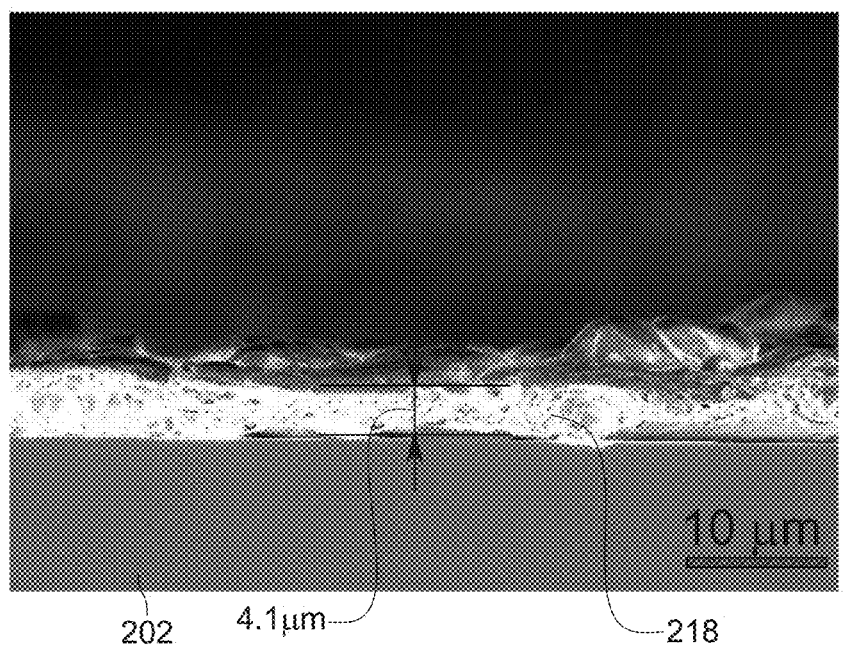
FIG. 3D illustrates a cross-section of the formed nanosheet on a given substrate.

FIG. 3B shows the substrate 202 on which the $CsPbBr_3$ NCs 208 were placed, and also the first solvent 210 and the second solvent 212. It is noted that a drifting $CsPbBr_3$ NCs nanosheet 312 self-assembly from the $CsPbBr_3$ NCs 208, and floats in the first and second solvents 210 and 212, while the solvents evaporate. FIG. 3B also shows the already formed sedimentary nanocrystal 318. Due to the slim nanosheet feature of the nanocrystals 208, part of the nanocrystals 208 floated up to the toluene solution's surface 314, and self-assembled, forming the drifting and very thin layer 312. Once the second solvent 212 completely evaporates, the drifting layer 312 settles down and covers the sedimentary nanocrystal 318, enhancing the continuity and conductivity of the resulting nanosheet 218. Note that the $CsPbBr_3$ NCs nanosheet 218 self-forms only between the electrodes 220A and 220B in FIG. 2C due to the hydrophilic properties of the second solvent. FIG. 3C illustrates a SEM image with high magnification of the nanosheet, which shows that the $CsPbBr_3$ nanosheet 218 does not contain any obvious grain boundaries, cracks, or pinholes (this is a perpendicular view) while FIG. 3D shows a large-view scope crossed SEM image of the perovskite nanosheet 218 having a thickness of about 4 μm. Smaller or larger thicknesses may be achieved with this process.

Figure 4A:
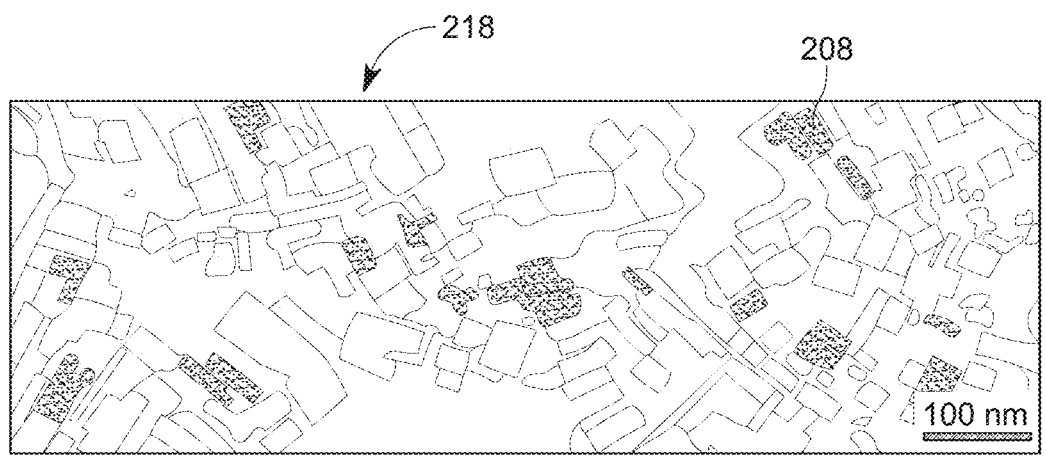
FIG. 4A is a high-resolution transmission electron microscopy image of the synthetized nanosheet.

The $CsPbBr_3$ NCs nanosheet 218 was synthesized as discussed above, through a room-temperature co-precipitation method. A high-resolution transmission electron microscopy (HRTEM) image illustrated in FIG. 4A, shows that the as-synthesized NCs adopt the desired nanosheet shape with a widespread distribution of lateral lengths, ranging from 10 nm (resembling quantum dots) to 100 nm, which differs significantly from uniform-sized NCs reported in the literature (see references [1] to [5]). However, the obtained thicknesses are confined to a much narrower range, with an average of ~3 nm, which corresponds to the exciton confinement range. The $CsPbBr_3$ NCs 208 spontaneously assembly into a face-to-face assembly that form the nanosheet 218, which is attributed to the organic matrix.

Figure 4B:
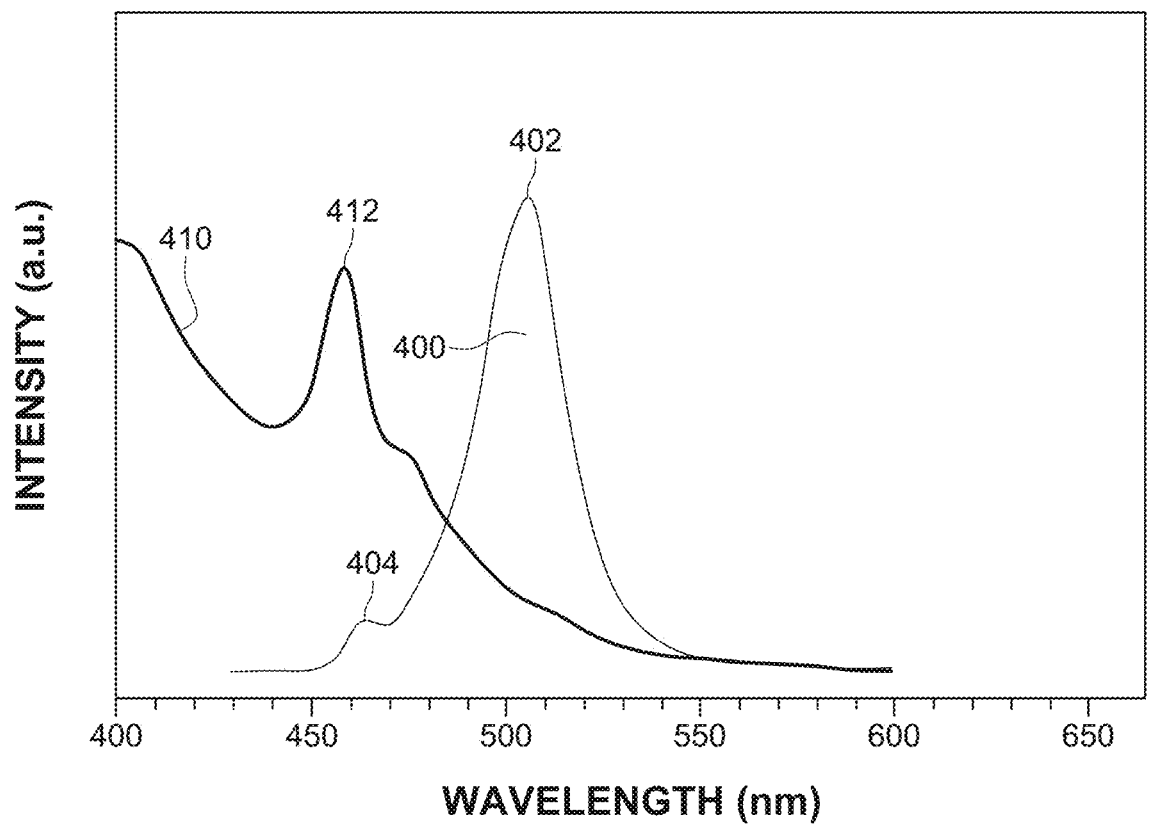
FIG. 4B illustrates the photoluminescence of the obtained nanosheet.

The as-synthesized NCs 208 are easily dispersed in non-polar solvents, such as toluene and hexane, forming a stable colloid with bright photoluminescence (PL) emissions 400 centered at 506 nm when excited by a 365 nm UV source, as shown by peak 402 in FIG. 4B. Compared to the $CsPbBr_3$ NCs previously reported in the literature [4], the colloid NCs show a relatively broad emission band with the full width at half maximum (FWHM) of 60 nm. Moreover, the minor peak 404 at 465 nm can be attributed to quantum confinement due to the narrow range of NC thicknesses (~3 nm on average), including the quantum dots, as such dimension is comparable to 7 nm Bohr diameter in cubic $CsPbBr_3$. The absorption spectrum 410 reveals the presence of an absorption peak 412 at 459 nm, which corresponds to the Stokes-shifted minor peak in the PL spectrum located at 465 nm. The shallow slope of the absorption spectrum edge corresponds to the FWHM broadening of the PL peak at 506 nm, which can be attributed to different NC sizes.

Figure 4C:
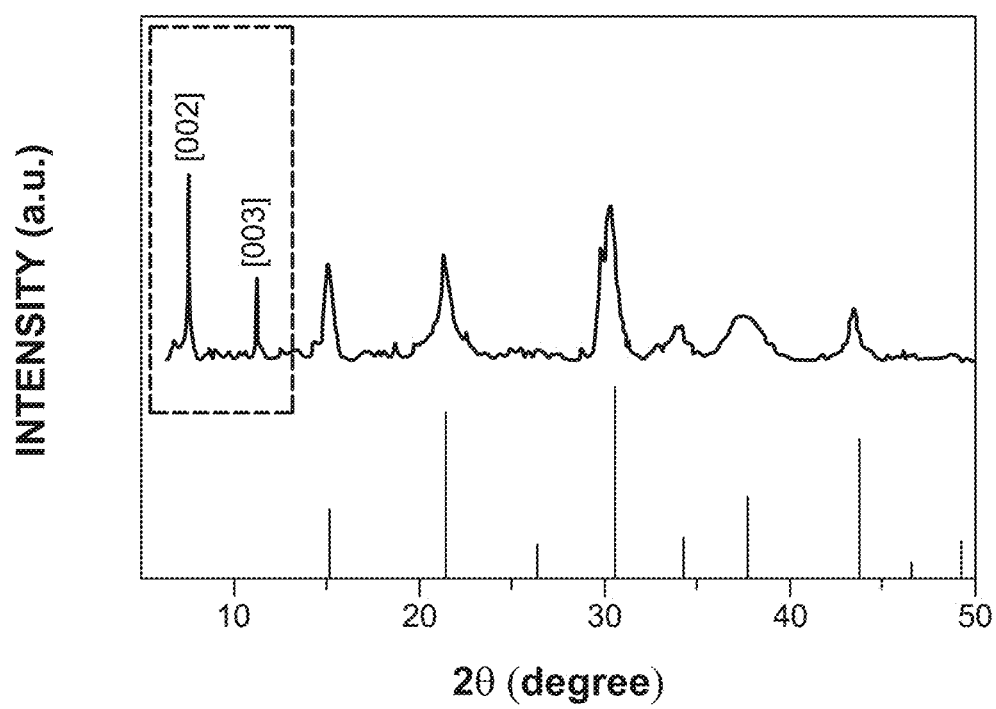
FIG. 4C illustrates an X-ray diffraction pattern of the synthesized nanosheet.

The X-ray diffraction (XRD) pattern of the synthesized $CsPbBr_3$ NCs 208 as a thin film or nanosheet on a substrate is shown in FIG. 4C and demonstrates that the NCs making the film possess a cubic structure. Three additional peaks at 3.8°, 7.5° and 11.2° emerged. Such low-angle diffraction peaks are usually ascribed to the ordered stacking of NCs or superstructures. Based on Bragg's law, the inter-plane spacing of 2.3 nm is calculated, which is about twice the molecular length of the ligands (i.e., octylamine and octanoic acid). The measurements of the CsPbBr$_3$ NCs nanosheet reveal that the CsPbBr$_3$ films retain highly bright PL emissions under UV. The PL quantum yield (PLQY) of NCs in solution reached 99%, whereas the PLQY remains high after drop-casting the NCs as a film (~65%).

Figure 4D:
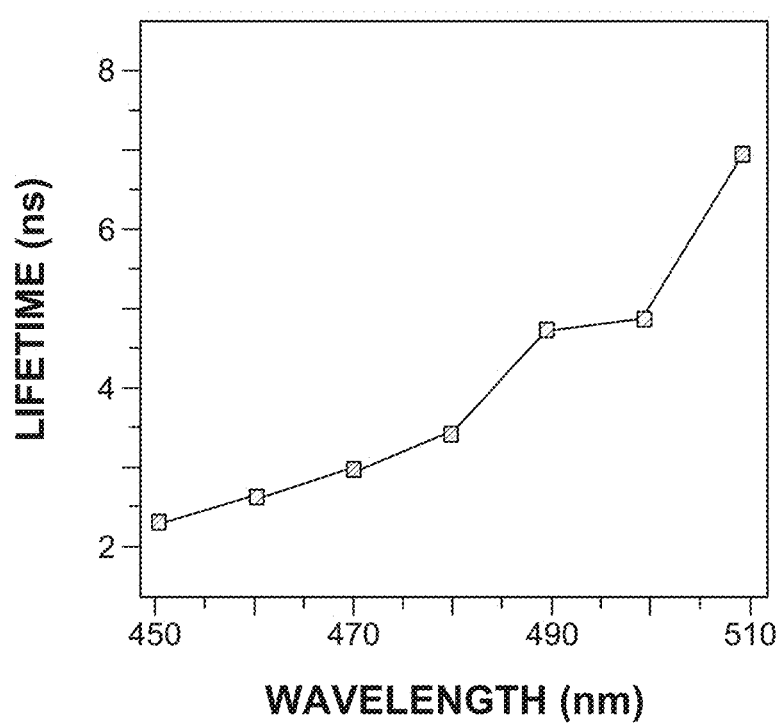
FIG. 4D illustrates lifetime increases of the carriers in the nanosheet as the wavelength of the incoming light increases.

To understand the carrier dynamics of CsPbBr$_3$ NCs 208, 2D time-resolved photoluminescence (TRPL) spectroscopy mapping was conducted in a Streak camera system and the delay traces at different wavelengths were extracted from the TRPL spectra. The calculated results are plotted in FIG. 4D, and they indicate that the lifetime of the carriers increases from 2.18 ns to 6.3 ns as the wavelength increases. As can be seen from the TRPL measurements, in the longer wavelength range, the TRPL decay spectra for 500 nm and 510 nm peaks (with a dominant intensity) follow a monoexponential decay. In contrast, in the shorter wavelength range, the TRPL decay spectra for peaks (450-490 nm) follow a bi-exponential decay, due to multiple centers as an efficient energy transfer from the confined states related to narrow-sized NC thicknesses to states associated to the other two dimensions, which are much larger than the thickness.

A crack-free uniform thin film (nanosheet) of ~4 µm thickness was obtained (shown in FIG. 3D) within a few minutes after drop-casting the colloidal NCs and drying under ambient conditions. In this embodiment, the colloidal NC concentration was selected (for example, 60 mg of the colloidal NC per 1 mL of mixed solvents, or in other words, 60 mg/mL is the concentration of perovskite NC in the solvent after being fabricated) for tuning the film thickness during the solution-processed uniform thin film fabrication. The spontaneous self-assembly process employed here is driven by the Van der Waals attraction between the hydrophobic ligands and the perovskite NC cores as a result of slow evaporation of the concentrated colloidal NC solution when solvent is drop-casted on a solid substrate. As the CsPbBr$_3$ NC sizes are not uniform, NCs of greater sizes are expected to be deposited first, forming the "precursor" frame (see element 318 in FIG. 3B) for the films 218. Conversely, the smaller-sized NCs (i.e., quantum dots) will fill any gaps between bigger NCs and thus, enhance film continuity, while eliminating most if not all the cracks, as illustrated in FIGS. 3B and 3C. An interesting phenomenon was observed by inventors, whereby smaller-sized CsPbBr$_3$ NCs floated to the toluene solution surface to form a drifting layer 312 as shown in FIG. 3B, thus further enhancing film continuity, and eliminating most if not all the grain boundaries and cracks.

In this regard, FIG. 3C shows no obvious grain boundaries, cracks or pinholes. None of these beneficial film characteristics have been attained via the traditional recyclable dissolution-recrystallization method, freeze-drying recrystallization method, thermal annealing recrystallization method, and have not been previously achieved in 2D perovskite nanosheet-formed films [3]. Although the obtained film 218 contained some distributed random small mesas 5-10 µm in length, these did not degrade the film continuity and quality. Additionally, the large cross-sectional area of the film shown in the SEM image presented in FIG. 3D indicates that the film thickness is homogeneously continuous.

In one embodiment, the drop-casting was used as a substitute for the rapidly evaporating solvents employed in spin-coating or sputter-coating methods, as the drop-casting method ensures that a greater quantity of solvent is retained. In addition, short ligands (octylamine and octanoic acid surfactants) selected in this method replace longer ligands (oleic acid and oleylamine) because such short ligands can be removed more easily by the subsequent annealing step 116, thus enhancing the film's electric properties.

The device 200 shown in FIGS. 2C and 3A was fabricated using the DSEISP strategy and this device acts as a PD device. As previously discussed, to fabricate the PD device 200, CsPbBr$_3$ NCs were dispersed into a toluene/hexane mix solution and then, these colloidal NCs were drop-casted (with the drop volume of about 8 µL) onto a horizontal 1.5 cm×1.5 cm patterned interdigitated contact electrode (IDE) 204 on a thick SiO$_2$ substrate 202 (for example, 280 nm thick). The NCs spontaneously self-patterned, as shown in FIG. 2C, and crystalized only between the IDEs 320A and 320B with well-defined edges, as shown in FIG. 3A. This spontaneous self-patterning was completed within about 10 s after the drop-casting process and does not affect the NC self-assembly process, thus forming a continuous and uniform as well as patterned film 218.

The self-patterning mechanism of the NCs can be attributed to (1) the hydrophilic difference between the electrodes 320A and 320B and the SiO$_2$ surface of the substrate 202, and (2) the good hydrophilic properties of hexane for both electrodes and SiO$_2$ surface, while toluene is hydrophilic for the electrodes only. Thus, when the toluene/hexane solution is drop-casted onto the substrate 202, it will rapidly create a smooth and flat surface. Moreover, (3) as the hexane has a low boiling point (69° C.), it evaporates at a faster rate relative to toluene (with the boiling point of 111° C.). Consequently, after the hexane has evaporated from the solution, the residual toluene remains on the electrodes 320A and 320B. In addition, (4) the slimness of the NCs 208 allows them to migrate with the remaining toluene solution to the areas between the electrodes 320A and 320B. This process is similar to the polystyrene nanoparticle spontaneous flow described by the Marangoni flow phenomenon [6].

The method discussed above with regard to FIG. 1 is advantageous over the existing methods of making optoelectronic devices or related devices for the following reasons. The patterning technologies aimed at metals, metal oxides, semiconductors, semiconductor oxides or conducting polymers are already widely used to adjust the charge separation or enhance light capture. However, as the perovskite adhesion to the traditional wafer is poor, it is highly unstable under certain conditions, such as UV light and chemical solution exposure. Owing to these reasons, it is very difficult to integrate the perovskite materials using traditional photolithography and photoresist technologies, thus hindering the ongoing miniaturization and alignment efforts for these materials.

The method of FIG. 1 addresses all these issues effectively. As the above discussed findings indicate, the perovskite NCs 208 can be deposited on selective areas automatically, so that the application of this method will not only enhance the fabrication efficiency of devices based on perovskite materials, but will also avoid contamination of adjacent areas, as the pattered CsPbBr$_3$ films self-assembled on the electrode region only as shown in FIGS. 2A to 2C.

The device 200 (for example, a PD device) fabricated using the method of FIG. 1 exhibits high performance. The substrate 202, which is a hydrophobic material, could be any type of wafer, such as silicon, silicon oxide or glass substrate, as well as flexible substrates, whereas the electrodes 220A and 220B may be made of metal, ITO or selected UV-ozone treatment area on the wafer and they serve as good hydrophilic material candidates. In comparison to the existing methods as the transfer printing, inkjet printing, or laser direct writing, the novel DSEISP strategy offers many advantages, as it is flexible, easy to fabricate, non-destructive, cost-effective and equipment-free, while greatly economizing on the raw materials.

Figure 5A:
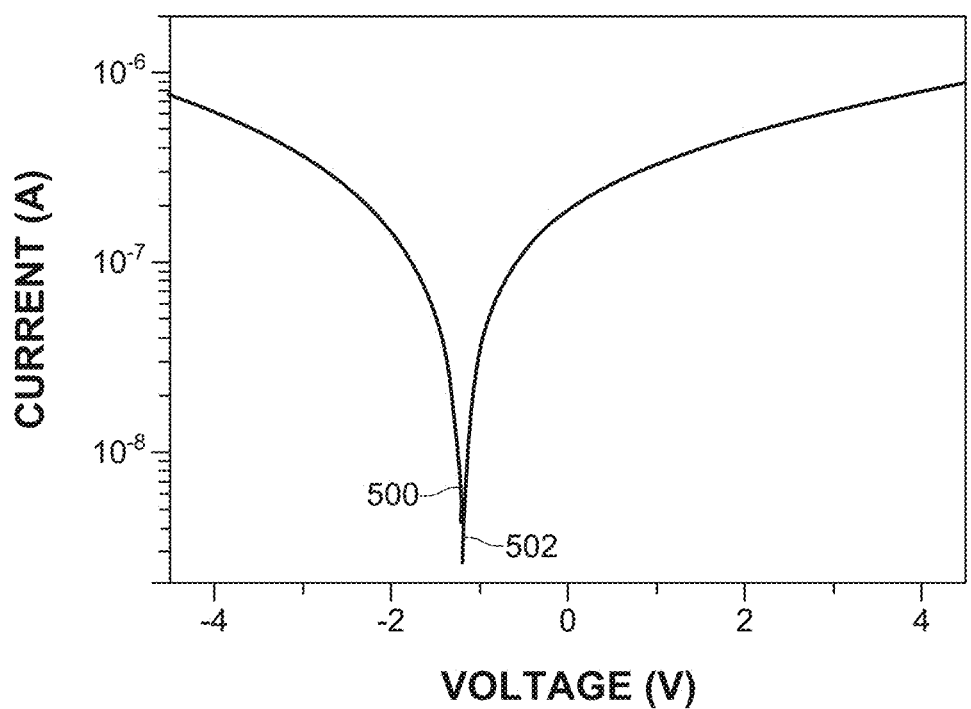
FIG. 5A illustrates the I-V characteristics of an optoelectronic device including CsPbBr$_3$ nanocrystals assembled into the nanosheet.

Some performance characteristics of the optoelectronic device 200 fabricated by drop-casting $CsPbBr_3$ colloidal NCs on an as-prepared electrode substrate with a 100 μm channel length are now discussed. The I-V characteristics in dark (curve 500) and under 100 mW/cm² white illumination (curve 502) of the pristine (non-annealed) PD device 200 are illustrated in FIG. 5A. The two curves almost coincide, except for the bottom portion, indicating that the optoelectronic device shows no photo-response because the NC boundaries, which are filled with the remaining organic surfactants, hinder the transport of the photo-generated carriers. To activate the photoelectric response of the $CsPbBr_3$ film 218 of the optoelectronic device, the device was annealed in step 116 to remove the surfactants and recrystallize the $CsPbBr_3$ NCs and hence, induce the light response of the active layer of the as-fabricated optoelectronic device.

Figure 5B:
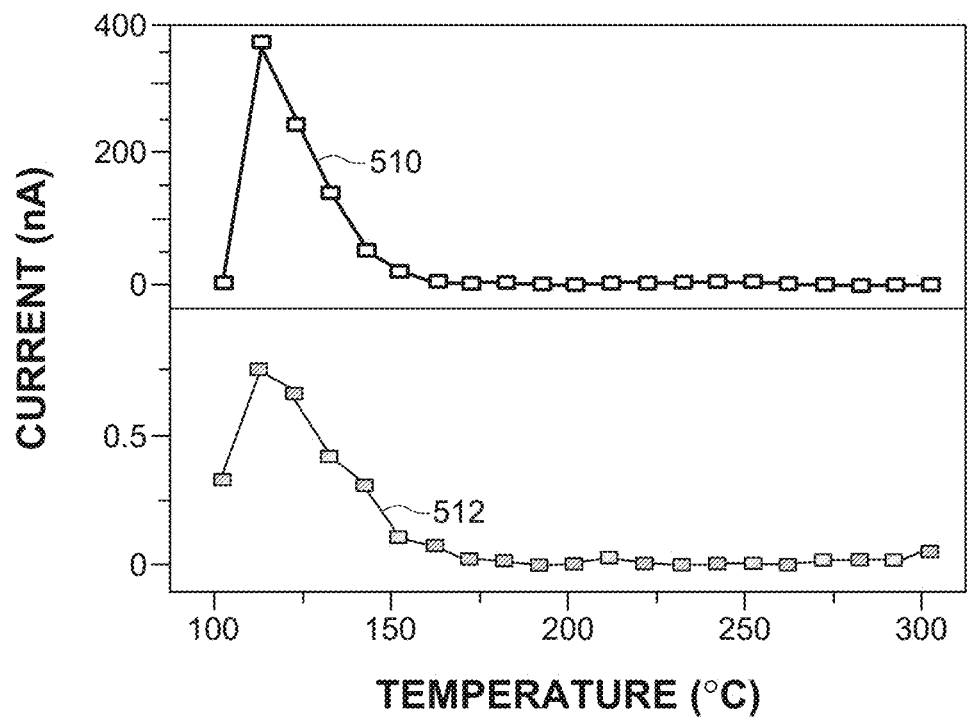
FIG. 5B illustrates the photocurrent generated in the CsPbBr$_3$ nanocrystals assembled into the nanosheet as a function of an annealing temperature of the optoelectronic device.

An enhancement in the photo-response is observed when an annealing temperature of 100° C. is applied to the as-assembled optoelectronic device 200. Therefore, to systematically verify the dependence of the generated photocurrent on the annealing temperature, the photocurrent (under a white light with a 100 mW/cm² power density) and dark current dependence on the annealing temperature were examined at 1 V for optoelectronic devices annealed in the 100-300° C. temperature range in 10° C. increments, as shown in FIG. 5B. Note that curve 510 shows the photocurrent under white light and curve 512 shows the dark current dependence. For all the optoelectronic devices tested, it was found that, on average, the photocurrent increases until the temperature reached 110° C. and then decreased. The highest photocurrent (360 nA) is obtained at the annealing temperature of 110° C. Above 110° C., however, the photocurrent gradually decreases toward the minimum at ~160° C. The dark current (curve 512 in FIG. 5B) follows a similar pattern. Specifically, from 170° C. to 290° C., the dark current declines to a minimum value in the 2.6-28 pA range.

Figure 5C:
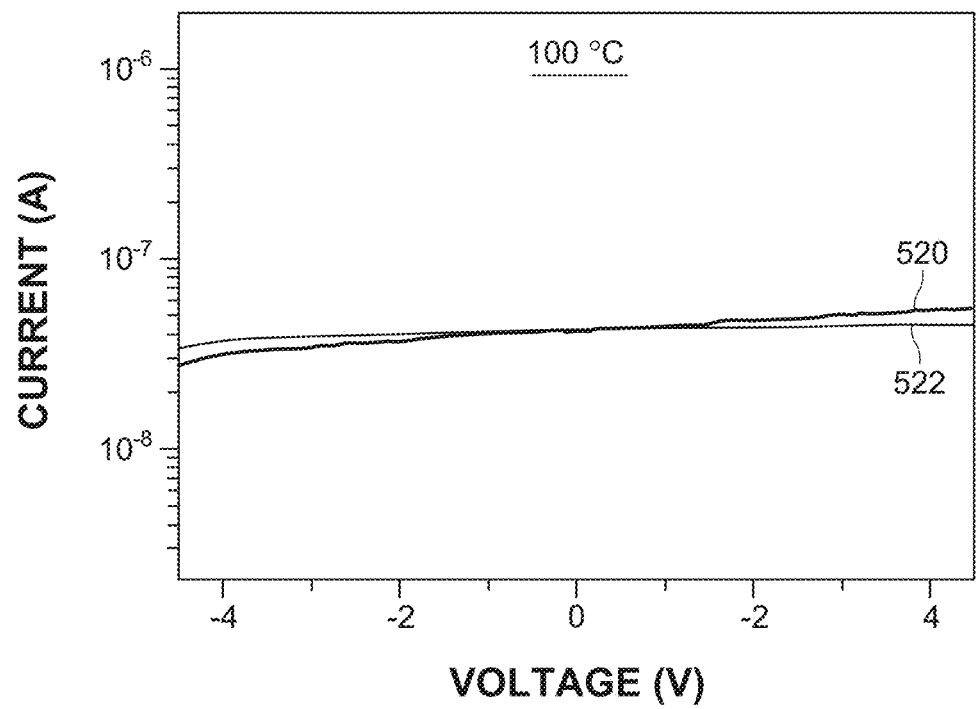
FIG. 5C illustrates the I-V characteristic of the optoelectronic device including the CsPbBr$_3$ nanocrystals assembled into the nanosheet, under dark and white light illumination.
Figure 5D:
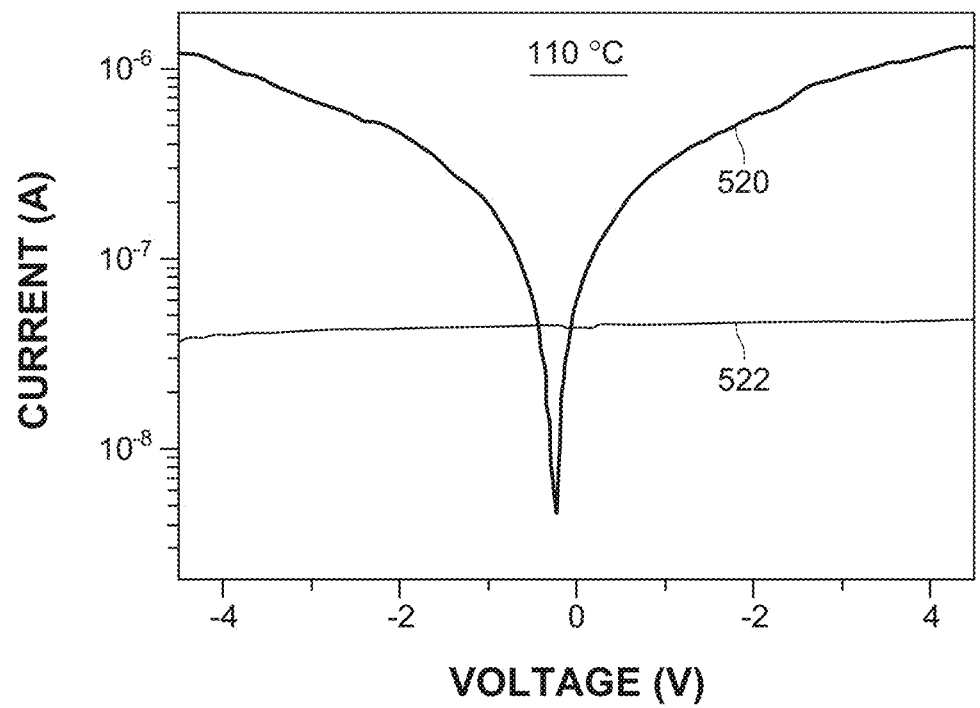
FIG. 5D illustrates the I-V characteristic of the optoelectronic device at different annealing temperatures.

FIG. 5C shows the I-V characteristics of the optoelectronic device in dark (curve 522) and under white illumination (curve 520) when annealed at 100° C. and FIG. 5D shows the same characteristics when the PD device is optimized at the annealing temperature of 110° C., respectively. Unlike the currents for the pristine optoelectronic device shown in FIG. 5A, in the annealed optoelectronic devices, the dark current 522 is markedly suppressed, which implies that the recrystallized perovskite exhibits intrinsic semiconductor features with low-defect density. As the annealing temperature increases, the photocurrent is initially suppressed (as shown in FIG. 5C) compared to that of the pristine optoelectronic device (FIG. 5A) and is subsequently reactivated (as shown in FIG. 5D). The optimum photocurrent of $10^{-6}$ A is achieved after 110° C. annealing, whereas a current of $4 \times 10^{-6}$ A is obtained with 100° C. annealing at 4 V bias.

Figure 5E:
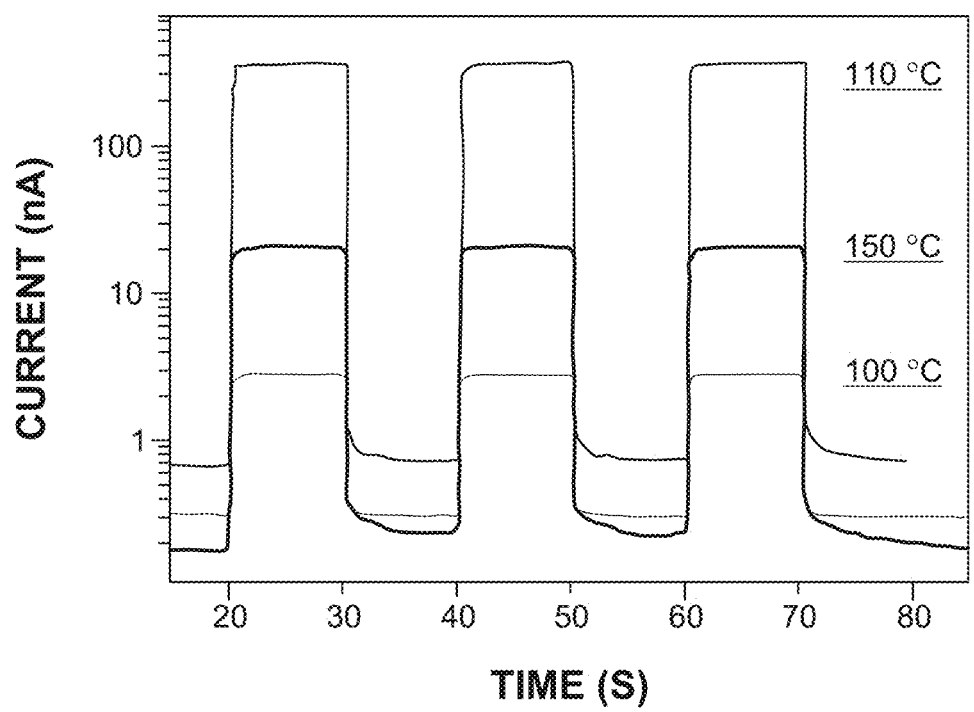
FIG. 5E illustrates an on/off transient photocurrent at different annealing temperatures of the optoelectronic device.

FIG. 5E shows on/off transient photocurrent cycles at different annealing temperatures. All optoelectronic devices examined by the inventors are stable and are capable of reversible and rapid switching between the dark and the illuminated state. The response-recovery times for all tested devices at 100, 110 and 150° C. annealing temperature do not exceed an average of 80 ms.

Figure 5F:
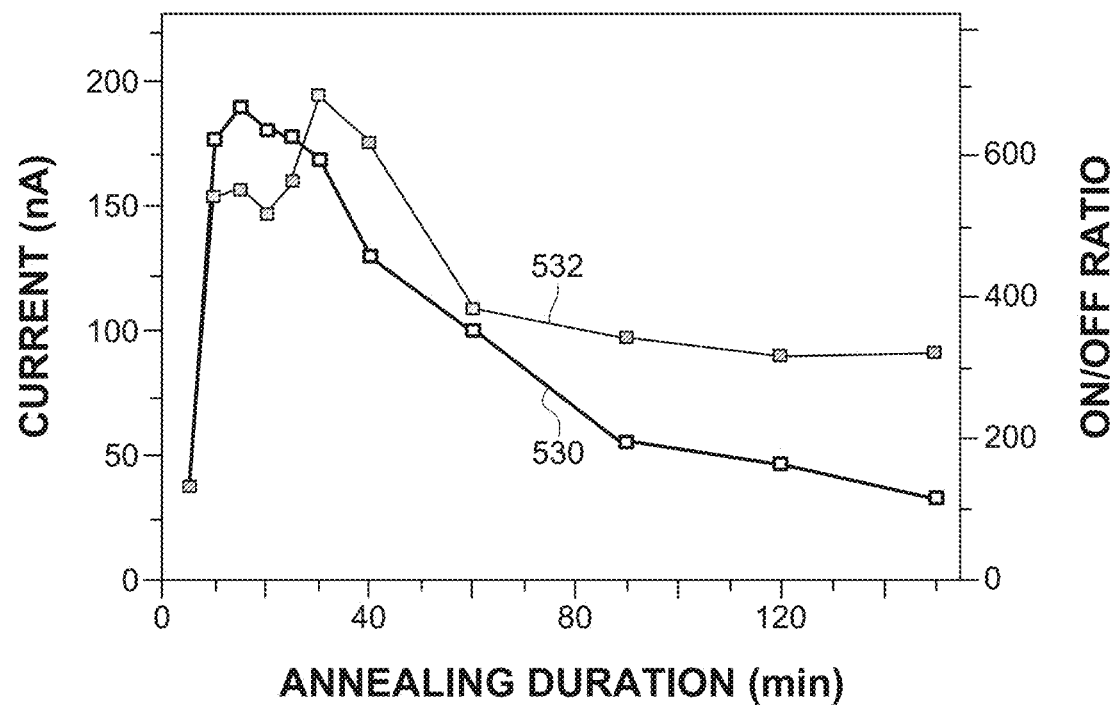
FIG. 5F illustrates how the annealing temperature of the photoelectronic device affects the photocurrent produced by the photoelectronic device.

A further measurement of the effect of the thermal annealing process on the optoelectronic device revealed that the device's photo-responsivity is activated within the optimum temperature range. However, device performance degradation occurs when the thermal treatment duration increases even at the optimum temperature, as shown in FIG. 5F. The photocurrent 530 and the on/off ratio curve 532 as a function of the annealing time duration at 110° C. under ambient conditions are shown in FIG. 5F. It is observed that in the first five minutes of annealing, the optoelectronic devices are not fully activated. As the annealing time increases, the optoelectronic activation occurs and the optimum performance is achieved for a 10-30 minute annealing range, followed by a performance degradation as the duration increases. After 30 minutes (the optimum duration), the photocurrent declines by less than 20% of the maximum value and the optoelectronic device maintains 50% of the peak efficiency after one hour. On the other hand, the on/off ratio 532 of the optoelectronic device is well above 500 after 40 minutes of annealing as an optimized on/off ratio value. These findings indicate that the optoelectronic device 200 has a good thermal stability, and its functionality remained adequate for 30 minutes even in the high-temperature environment of 110° C.

Figure 6:
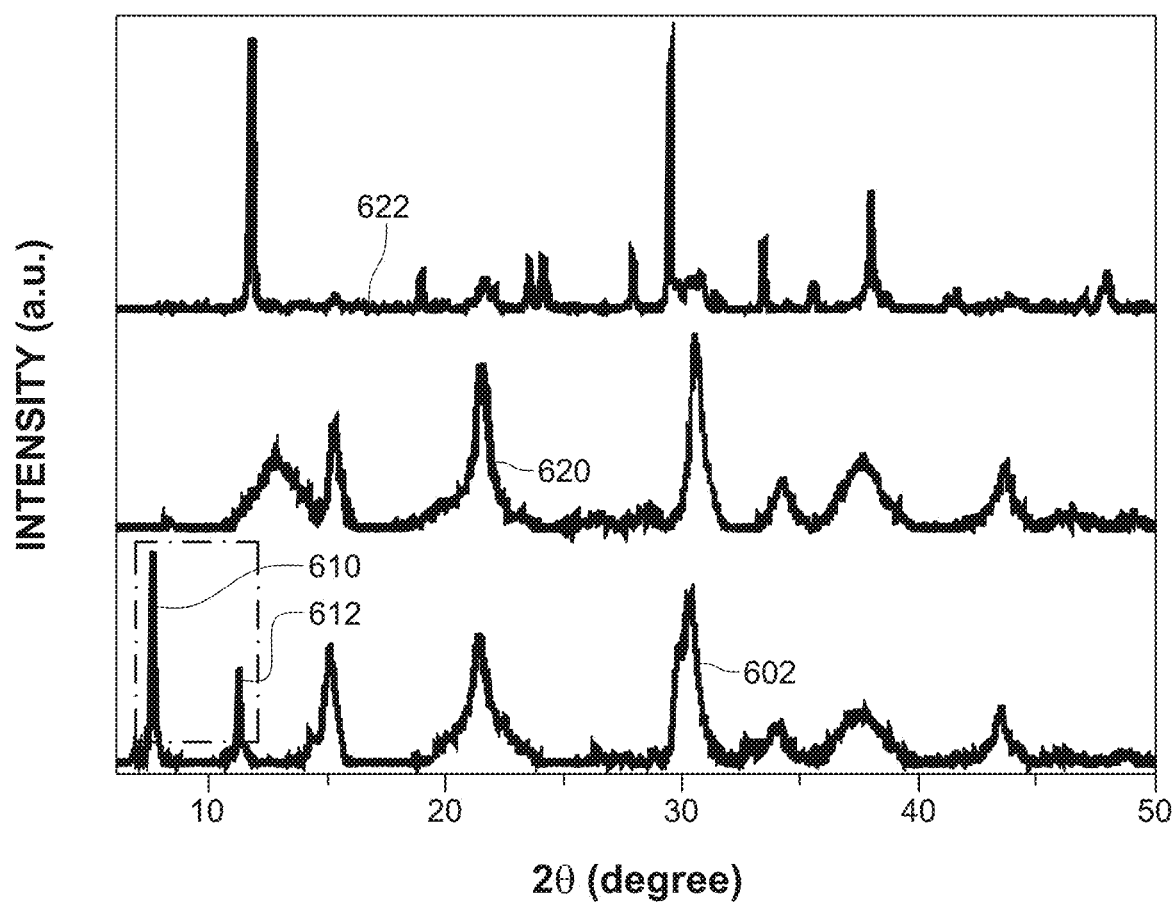
FIG. 6 illustrates how the annealing temperature influences the crystal structure of the nanosheet.

To better understand the influence of the annealing treatment on the $CsPbBr_3$ NCs structure and optical quality, TEM (transmission electron microscopy), XRD, and TRPL measurements were conducted for both pristine and annealed $CsPbBr_3$ NCs. The annealing treatment was conducted on dry perovskite films for the XRD and TRPL experiments, whereas for the TEM experiments, the perovskite film was kept in the toluene solution and was subjected to the annealing treatment before being drop-casted onto a TEM grid. If was observed that after annealing at 100° C. in toluene, the $CsPbBr_3$ NC size increased and their shape became rod-like as the NC thickness increased from ~3 nm to ~10 nm. The shape of a single NC can be clearly distinguished, indicating that crystal quality improved after annealing. The XRD spectra for pristine (see curve 602) and annealed films (see curve 620 for 110° C. annealing and curve 622 for 150° C. annealing) are shown in FIG. 6, indicating that the pristine peaks 610 and 612 at 2θ=7.5° and 11.2°, respectively, disappear after 110° C. annealing. Both TEM and XRD results reveal that the surfactants have been released (except for some trace amounts) after annealing and the NCs are "recrystallized" to a unit cell of higher quality, leading to a significant photo-response. In addition, FIG. 6 illustrates the XRD scan 622 of the film annealed at 150° C., showing the chemical phase transformation into tetragonal $CsPb_2Br_5$, which leads to the observed photocurrent reduction shown in FIG. 5B. TRPL measurements reveal that the NC lifetime dramatically increases (by more than 16 times, i.e., from 5.16 ns to 86 ns). Such extended lifetime may be due to reduced defect density of the annealed $CsPbBr_3$ thin films or the increased carrier diffusion length as the carrier decay lifetime r depends on the charge diffusion length equation $L_D = \sqrt{D\tau}$, where D is the diffusion constant.

Figure 7A:
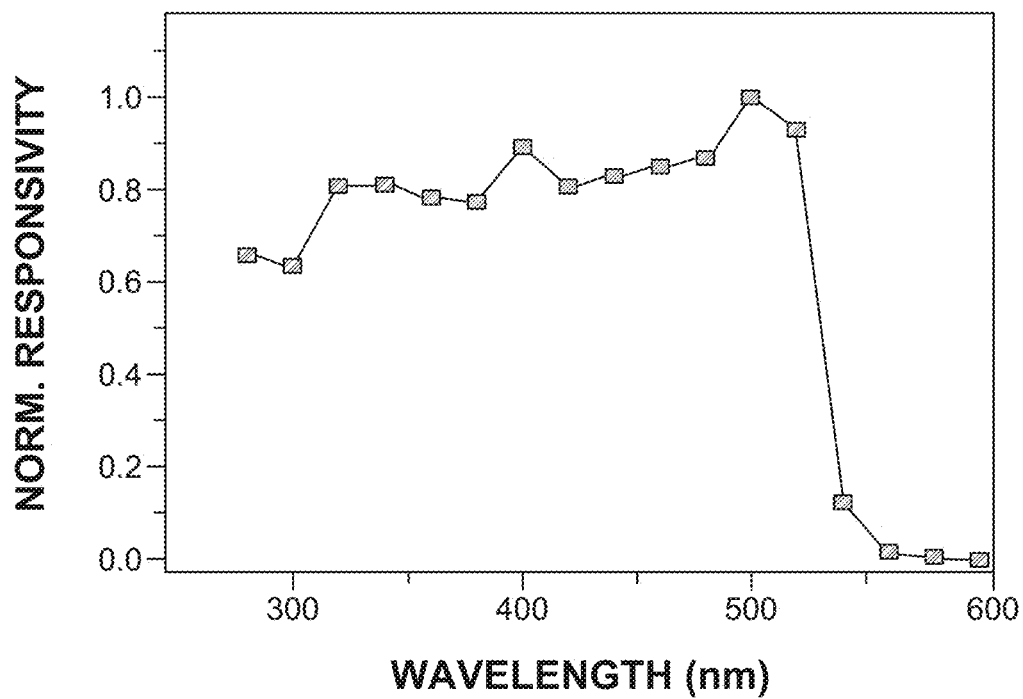
FIG. 7A indicates the normalized responsivity of the annealed photoelectronic device as a function of the light source's wavelength.
Figure 7B:
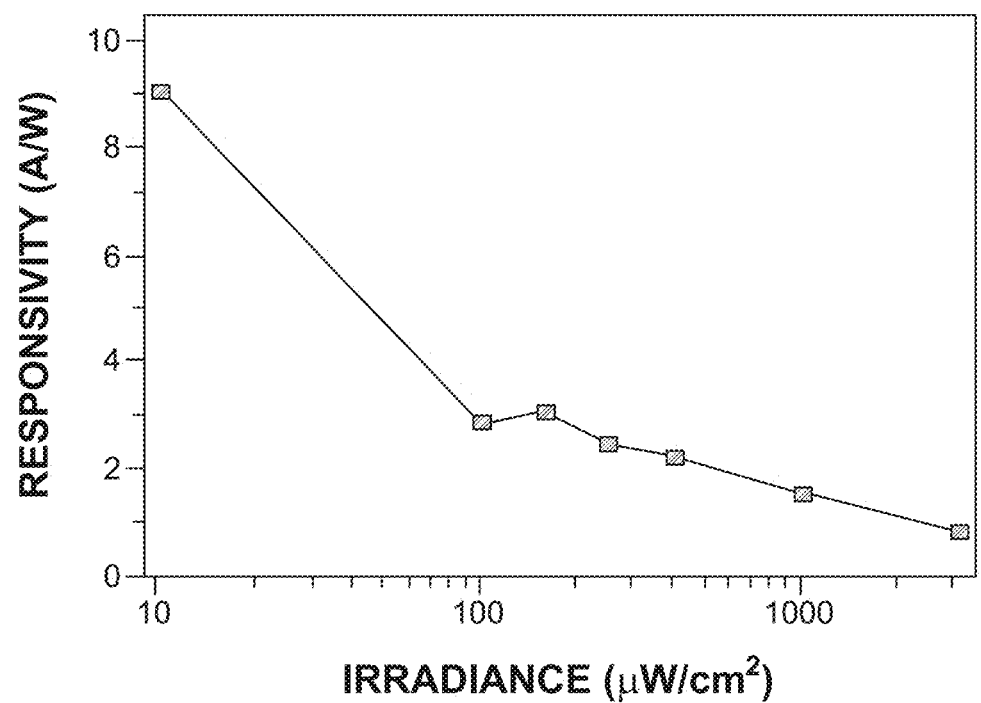
FIG. 7B illustrates a relationship between responsivity and irradiance for the nanosheet.

FIG. 7A shows the normalized responsivity of the annealed optoelectronic device 200 as a function of the light source's wavelength, which indicates that the maximum responsivity is achieved at about ~500 nm. Above this wavelength, the optoelectronic device's responsivity declines, coinciding with the bandgap of the $CsPbBr_3$ (see FIG. 4B). However, the optoelectronic device's responsivity is affected by many factors, such as the electrode channel area, irradiance and bias voltage. To examine the effect of these factors on the optoelectronic device's responsivity, optoelectronic device responses were detected using 3 μm channel length and 242 μm channel width. Utilizing a 488 nm laser as the light source and employing power filters to control the light intensity, the dependence relationship between responsivity and irradiance at a bias of 1 V and 5 V was obtained, as shown in FIG. 7B. It was found that the higher bias with the lowest irradiance yields the highest responsivity. The optimum responsivity of 9.04 $AW^{-1}$ was obtained under 10.2 $\mu Wcm^{-2}$ irradiance and 5 V bias. This value is much higher than the figures reported for commercial Si PDs (0.2 $AW^{-1}$) and is comparable to pure $CsPbX_3$/ $MaPbX_3$ films [3].

Figure 7C:
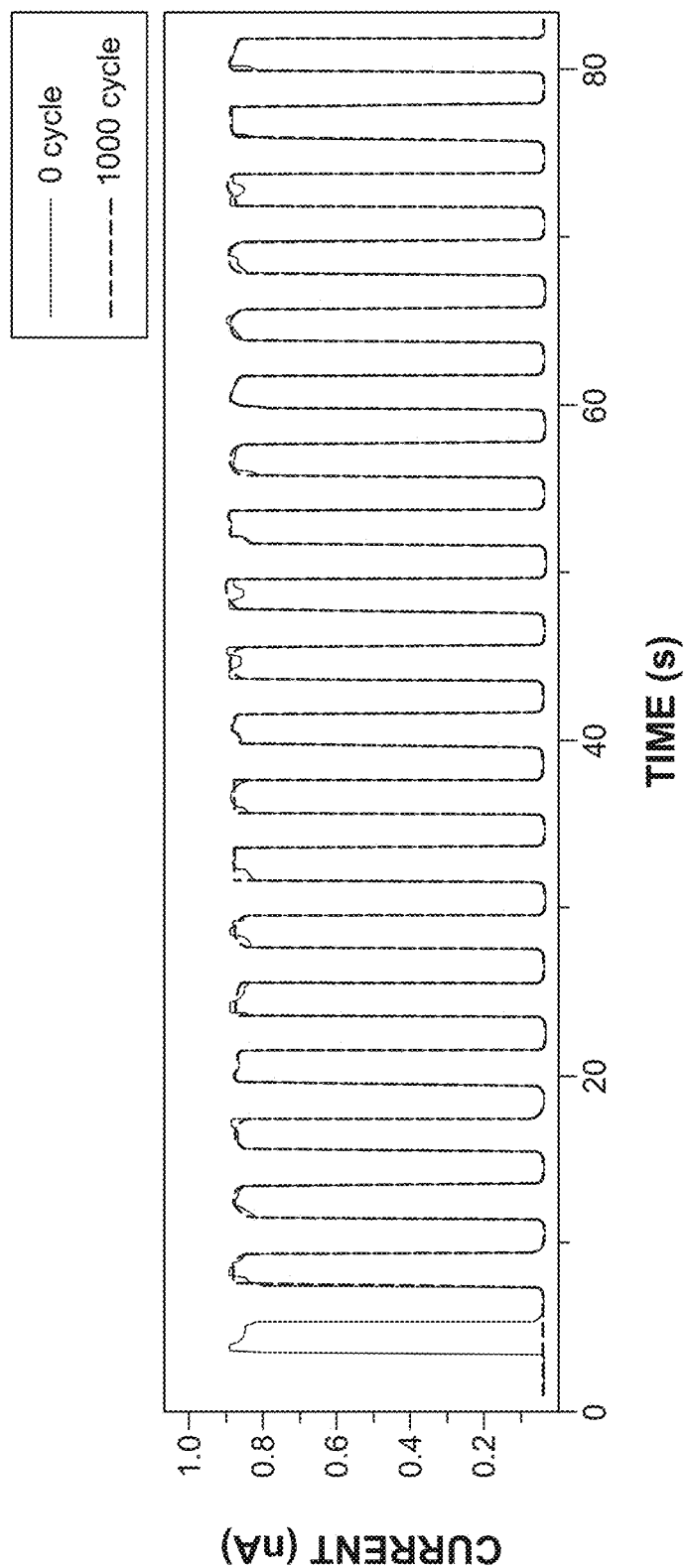
FIG. 7C illustrates a comparison of the on/off current before bending and after 10,000 bending cycles of the nanosheet.
Figure 7D:
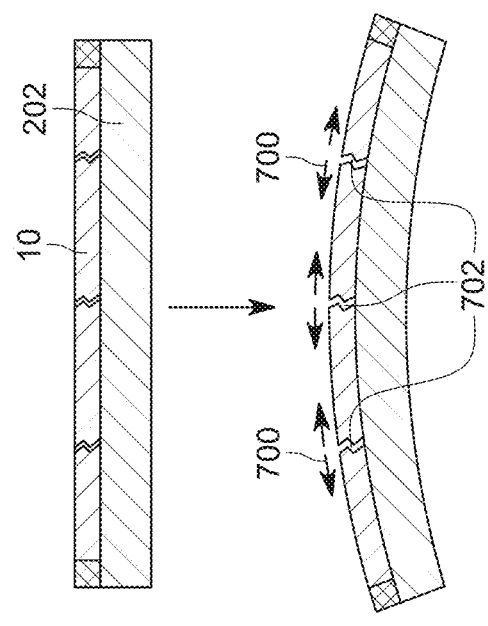
FIG. 7D illustrates how the crack-free structure of the nanosheet disperses the applied stress relative to a traditional perovskite structure that has cracks and other defects.
Figure 7D:
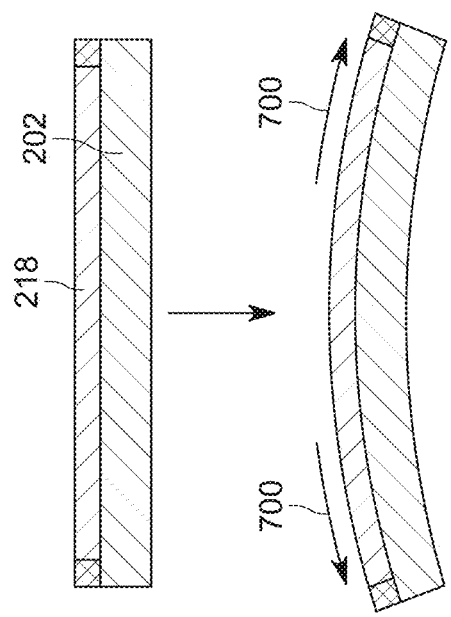

Based on these results, it is concluded that the crack-free and grain boundary-free uniform films 218 based on $CsPbBr_3$ NCs 208 obtained with the method of FIG. 1, can be employed in applications requiring great device flexibility and continuity across large areas. To demonstrate the structural relaxation and flexibility of the as-obtained NCs films 218, $CsPbBr_3$ NCs 208 in toluene solvent were drop-casted on patterned Au/Ti/polyimide flexible substrates. After the solvent dried, the polyimide substrate was annealed for 10 minutes at 110° C. Utilizing a bending-recovering process with the bending radius of 4 mm, a comparison of the on/off current before bending and after 10,000 bending cycles was obtained, as shown in FIG. 7C (the bias voltage was 1 V and the source light was supplied by a 100 $mW/cm^2$ white lamp light). A very slight photocurrent decline (0.02 nA) with ~2% fluctuations is observed, indicating that the optoelectronic device made with the novel method of FIG. 1 is extremely stable. Such superior device performance is attributed to the crack-free films 218 that could bear the bending stress 700 evenly, as shown in FIG. 7D. Conversely, the stress 700 will be released along the cracks 702 when bending a cracked perovskite film 710 and will result in unrecoverable damage.

Figure 8:
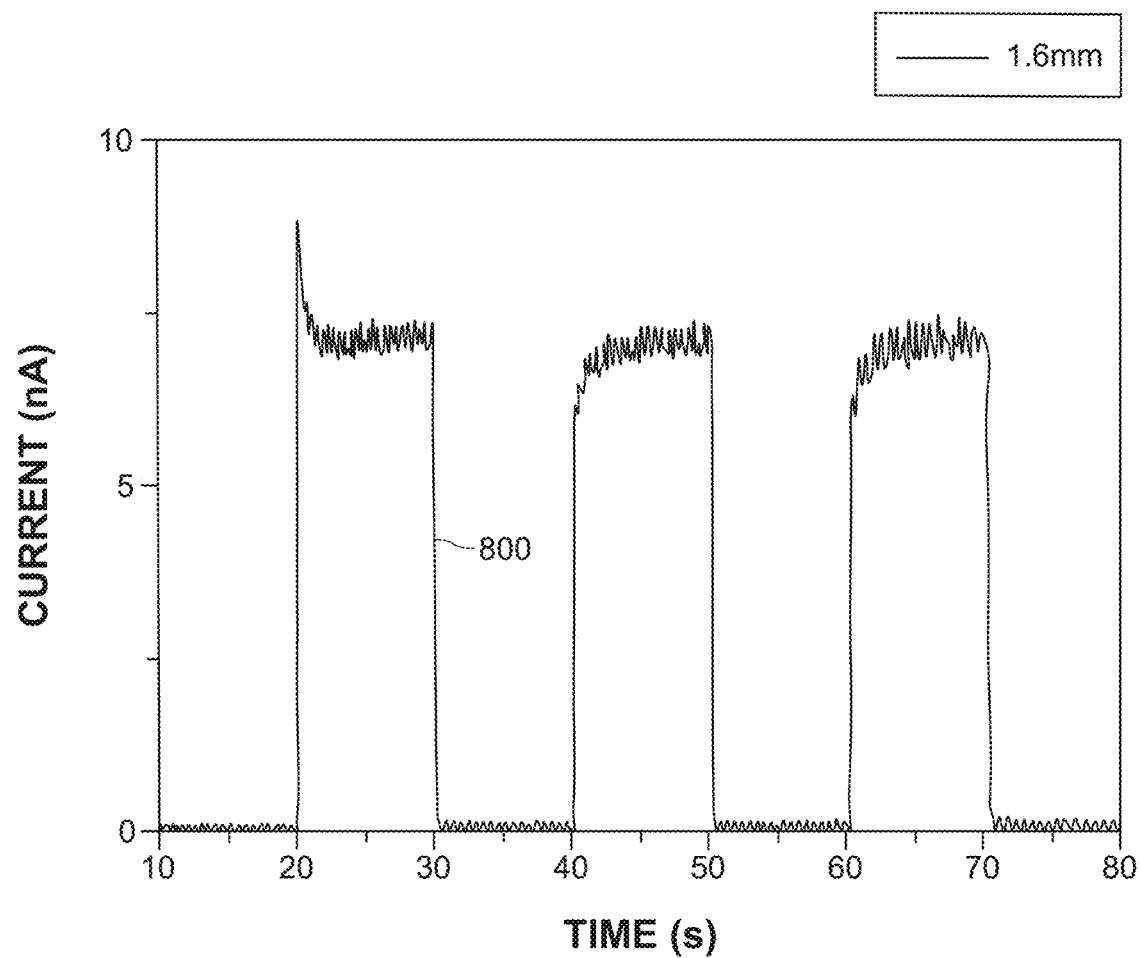
FIG. 8 illustrates the rapid switching capability of the optoelectronic device having the nanosheet.

The film continuity required for large-scale applications was further demonstrated by the conductive length between the two electrodes of the optoelectronic device. In particular, the channel length of the novel optoelectronic device 200 is much longer (about 100 μm) than that obtained previously (<20 μm). Furthermore, to confirm that the obtained film is super-continuous, the conductive length of the novel $CsPbBr_3$ film 218 is in the order of centimeters, as measured by detecting a current between two electrodes positioned 1 cm apart, which is considered a significant distance compared to that reported in other studies. In addition, an optoelectronic device with 1.6 mm electrode intervals (with the two electrodes positioned as shown in FIG. 3A) was fabricated using continuous instead of patterning film to examine the high continuity of the $CsPbBr_3$ films in large-scale devices, which is challenging for the traditional methods. The measurements confirmed that the optoelectronic device 200 possesses a rapid switching capability and produces a photocurrent of about 7.5 nA under 100 mW illumination at a base voltage of 20 V, as shown in FIG. 8. Note that FIG. 8 shows a current versus time curve 800 of a super-long channel optoelectronic device (the patterned electrode with a 1.6 mm channel length optoelectronic shown in FIG. 3A was used) using a continuous film 218 instead of patterned film, overcoming such challenging. The optoelectronic device was thermally treated by annealing at 150° C. The bias voltage was 20 V and the source light was supplied by a 100 $mW/cm^2$ white lamp light). Thus, it was shown that the novel, large and continuous film 218 can be employed in large-area device applications, such as perovskite solar cell panels.

All these characteristics show that a novel type of ultra-thin $CsPbBr_3$ NCs with 2D nanosheet features material was synthesized following the method illustrated in FIG. 1, and this new material forms uniform, crack-free, self-patterned films that can be used for large-scale and flexible cost-effective applications. Utilizing this method, large, continuous-area, crack-free, dense, high-quality $CsPbBr_3$ films 218 were fabricated using the "self-assembly" approach discussed herein. Moreover, a self-patterned layer of $CsPbBr_3$ NCs was fabricated by using the DSEISP strategy, whereby perovskite NCs can be deposited on areas of interest automatically, without a need for traditional photolithography. This novel method not only enhances the fabrication efficiency of optoelectronic devices, but also avoids contamination of adjacent areas due to the self-patterning nature of the novel material, resulting in high-performance devices. This method can be applied to fabricate any optoelectronic device, such as perovskite-based lasers, x-ray imaging, photovoltaic, and electronic devices.

The disclosed embodiments provide a new method for producing $CsPbBr_3$ perovskite nanocrystals with two-dimensional nanosheet features. It should be understood that this description is not intended to limit the invention. On the contrary, the embodiments are intended to cover alternatives, modifications and equivalents, which are included in the spirit and scope of the invention as defined by the appended claims. Further, in the detailed description of the embodiments, numerous specific details are set forth in order to provide a comprehensive understanding of the claimed invention. However, one skilled in the art would understand that various embodiments may be practiced without such specific details.

Although the features and elements of the present embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

REFERENCES

[1] Y. Bekenstein, B. A. Koscher, S. W. Eaton, P. Yang, A. P. Alivisatos. *J Am Chem Soc*, 2015, 137, 16008.

[2] L. Lv, Y. Xu, H. Fang, W. Luo, F. Xu, L. Liu, B. Wang, X. Zhang, D. Yang, W. Hu. *Nanoscale*, 2016, 8, 13589.

[3] J. Song, L. Xu, J. Li, J. Xue, Y. Dong, X. Li, H. Zeng. *Advanced Materials*, 2016, 28, 4861.

[4] J. Shamsi, Z. Dang, P. Bianchini, C. Canale, F. Di Stasio, R. Brescia, M. Prato, L. Manna. *Journal of the American Chemical Society*, 2016, 138, 7240.

[5] Q. A. Akkerman, S. G. Motti, A. R. Srimath Kandada, E. Mosconi, V. D'Innocenzo, G. Bertoni, S. Marras, B. A. Kamino, L. Miranda, F. De Angelis, A. Petrozza, M. Prato, L. Manna. *Journal of the American Chemical Society*, 2016, 138, 1010.

[6] Y. Cai, B.-m. Zhang Newby. Marangoni Flow-Induced Self-Assembly of Hexagonal and Stripelike Nanoparticle Patterns. *Journal of the American Chemical Society*, 130 (19):6076-6077. 2008.

What is claimed is:

1. A method for forming $CsPbBr_3$ perovskite nanocrystals into a two-dimensional (2D) nanosheet, the method comprising:
providing $CsPbBr_3$ perovskite nanocrystals;
mixing the $CsPbBr_3$ perovskite nanocrystals into a mixture of a first solvent and a second solvent, to form a solution of the $CsPbBr_3$ perovskite nanocrystals, the first solvent, and the second solvent; and
forming an optoelectronic device by patterning the $CsPbBr_3$ perovskite nanocrystals into a nanosheet, between first and second electrodes,
wherein the first solvent is selected to evaporate before the second solvent, and
wherein formed nanosheet includes trace amounts of octylamine and octanoic acid.

2. The method of claim 1, wherein the first solvent is selected to be hydrophilic to a substrate of the optoelectronic device and the first and second electrodes, and the second solvent is selected to be hydrophilic only to the first and second electrodes.

3. The method of claim 1, wherein the first solvent is hexane and the second solvent is toluene, and a volume ratio between the hexane and the toluene is in a range of 1:2 to 2:1.

4. The method of claim 1, further comprising:
drop-casting the solution on a substrate of the optoelectronic device, over and between the first and second electrodes.

5. The method of claim 4, further comprising:
fully evaporating the first solvent to form a drifting $CsPbBr_3$ nanocrystals nanosheet by self-assembly of the $CsPbBr_3$ nanocrystals.

6. The method of claim 5, further comprising:
fully evaporating the second solvent to form the $CsPbBr_3$ nanocrystals nanosheet between the first and second electrodes.

7. The method of claim 6, further comprising:
annealing the $CsPbBr_3$ nanocrystals nanosheet to activate the optoelectronic device.

8. The method of claim 7, wherein the step of annealing takes place at a temperature between 100 and 150° C.

9. The method of claim 7, wherein the step of annealing takes place at substantially 110° C.

10. The method of claim 1, further comprising:
providing Cs precursors;
providing $PbBr_2$ precursors; and
mixing the Cs precursors with the $PbBr_2$ precursors to obtain the $CsPbBr_3$ perovskite nanocrystals.

11. The method of claim 1, further comprising:
patterning the first and second electrodes as interdigitated electrodes on a SiO2 substrate.

12. A method for assembling inorganic perovskite nanocrystals into a two-dimensional (2D) nanosheet, the method comprising:
providing inorganic perovskite nanocrystals;
mixing the inorganic perovskite nanocrystals into a mixture of a first solvent and a second solvent to form a solution of the inorganic perovskite nanocrystals, the first solvent, and the second solvent; and
forming an optoelectronic device by patterning the inorganic perovskite nanocrystals into a nanosheet, between first and second electrodes,
wherein the first solvent is selected to evaporate before the second solvent, and
wherein the formed nanosheet includes trace amounts of octylamine and octanoic acid.

13. The method of claim 12, wherein the inorganic perovskite nanocrystals are $CsPbBr_3$ nanocrystals.

14. The method of claim 13, further comprising:
drop-casting the solution on a substrate of the optoelectronic device, over and between the first and second electrodes;
fully evaporating the first solvent to form a drifting $CsPbBr_3$ nanocrystals nanosheet by self-assembly of the $CsPbBr_3$ nanocrystals;
fully evaporating the second solvent to form the $CsPbBr_3$ nanocrystals nanosheet between the first and second electrodes; and
annealing the $CsPbBr_3$ nanocrystals nanosheet to activate the optoelectronic device.

15. The method of claim 12, wherein the first solvent is selected to be hydrophilic to a substrate of the optoelectronic device and the first and second electrodes, and the second solvent is selected to be hydrophilic only to the first and second electrodes.

16. The method of claim 12, wherein the first solvent is hexane and the second solvent is toluene, and a volume ratio between the hexane and the toluene is in a range of 1:2 to 2:1.

* * * * *